United States Patent [19]

Wegleiter

[11] Patent Number: 4,929,300

[45] Date of Patent: May 29, 1990

[54] PROCESS FOR THE SEPARATION OF MONOLITHIC LED CHIP ARRANGEMENTS GENERATED ON A SEMICONDUCTOR SUBSTRATE WAFER

[75] Inventor: Walter Wegleiter, Nittendorf, Fed. Rep. of Germany

[73] Assignee: Siemens Aktiengesellschaft, Berlin and Munich, Fed. Rep. of Germany

[21] Appl. No.: 389,451

[22] Filed: Aug. 4, 1989

[30] Foreign Application Priority Data

Aug. 5, 1988 [DE] Fed. Rep. of Germany ....... 3826736

[51] Int. Cl.$^5$ ..................... H01L 21/306; B44C 1/22; C23F 1/02; C03C 15/00
[52] U.S. Cl. .................... 156/645; 156/656; 156/657; 156/659.1; 156/662; 437/226
[58] Field of Search ............... 156/645, 649, 652, 656, 156/657, 659.1, 662; 437/226, 227

[56] References Cited

U.S. PATENT DOCUMENTS 4,237,601 12/1980 Wodhouse et al. ................ 437/226

FOREIGN PATENT DOCUMENTS 0032801 7/1981 European Pat. Off. .
2438914 5/1980 France .

OTHER PUBLICATIONS

Patent Abstracts of Japan, vol. 9, No. 136 (E-320), (1859), Jun. 12, 1985, Abstract No. 60-20590 (A).
Standard European Search Report; Feb. 13, 1989; 3 pages.

Primary Examiner—William A. Powell
Attorney, Agent, or Firm—James G. Morrow; Eugene S. Indyk

[57] ABSTRACT

LED chip arrangements fabricated monolithically on a semiconductor substrate wafer are to be separated from one another by scribing in such a way that they can be properly arrayed to obtain a tight image-dot grid over several LED chip arrangements. The metallization of the back side of the semiconductor substrate wafer is exposed in the area of a prescribed separation track. Prior to the separation, a depression is etched into the back side of the semiconductor substrate wafer.

The process according to the invention is particularly useful in the manufacture of high-resolution LED arrays.

4 Claims, 1 Drawing Sheet

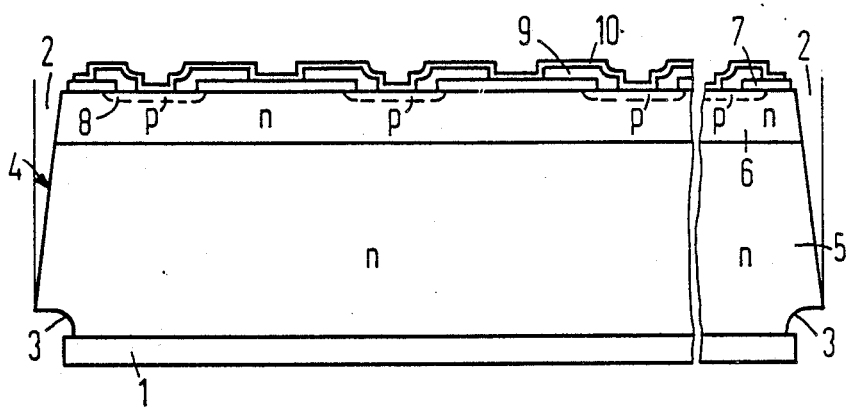

PROCESS FOR THE SEPARATION OF MONOLITHIC LED CHIP ARRANGEMENTS GENERATED ON A SEMICONDUCTOR SUBSTRATE WAFER

BACKGROUND OF THE INVENTION

1. Field of the Invention

The invention relates to a process for separating high-resolution LED (light-emitting diodes) chip arrangements fabricated monolithically on a semiconductor substrate wafer, which arrangements have on their back side a pervasive metallizing layer and are separated or sawed along prescribed tracks in border regions, so that they can be arrayed in series with other LED chip arrangements.

2. Technical Background

The economical manufacture of integrated X-Y controllable, large-surface LED displays with the highest possible number of image dots is limited for a number of reasons. A limitation that is purely in terms of area is still imposed today by the size of the epitaxied semiconductor substrate wafer. Another difficulty is the dissipation of heat that occurs in the display, which is a product of the path resistances of the semiconductor material and the metal contacts.

A familiar method for eliminating these difficulties is to make large-surface LED displays by forming a hybrid array of several monolithic LED chips. For this purpose, the LED array chips, which are manufactured monolithically on a wafer, are isolated or separated from one another in the desired number or arrangement. However, the separation process can be performed only with a high reject rate wherein the edge LED's are damaged by means of sawing or scribing.

An object of the invention is to eliminate these disadvantages in a process of the kind described in the introduction and to ensure that the LED chip arrangement that is generated on a semiconductor substrate chip and is to be separated from said chip can be properly arrayed in order to obtain a tight image-dot grid through several LED chip arrangements for a high-resolution LED array when several of these arrangements are aligned in series.

SUMMARY OF THE INVENTION

Briefly and in accordance with an embodiment of the present invention a process for the separation of high-resolution LED chip arrangements is provided. The LED chip arrangements are fabricated monolithically on a semiconductor substrate wafer and have on their back side a pervasive metallization layer and on their border regions separation tracks for arraying the LED chip arrangements in series with further LED chip arrangements. This process comprises the steps of:

exposing the metallization on the back side in the area of the separation tracks, etching in this area a depression into the back side of semiconductor substrate wafer, and then separating the LED chip arrangements on said tracks.

The exposure of the metallizing layer on the back side and the etching of a depression in the area of the sawing track in the back side of the semiconductor substrate wafer brings about a number of substantial advantages. For example, the cutting quality is improved, because it is not necessary to saw the film, onto which—in a familiar manner—the wafer has been secured by an adhesive in order to isolate or separate the chips or chip arrangements. In addition, protuberances no longer can occur on the back side of the chip, which would prevent a precise alignment of the chip. Also, when the chips are arrayed and connected, no solder or adhesive can rise up in the interstices, since there is no formation of hollow channels. In addition, the unavoidable wedge error that occurs as a result of the shape of the saw blade during scribing is reduced.

It is especially advantageous to introduce a "double saw cut." The proper way to make such a cut for a prescribed separation track is to saw out first one edge of the LED chip arrangement and then the other (adjacent) edge of the LED chip arrangement. By this technique, chips or chip arrangements that are to be arrayed or have been arrayed always have a defined interval or the prescribed width in the completed overall arrangement.

BRIEF DESCRIPTION OF THE DRAWING

Additional features of the invention and additional objects of the invention will be more readily appreciated and better understood by reference to the following detailed description which should be considered in conjunction with the drawing.

The drawing depicts a cross-section of the chip structure of an LED array.

DETAILED DESCRIPTION OF THE PREFERRED EMBODIMENT

The sole Figure illustrates an LED chip arrangement fabricated in monolithic technology on a semiconductor substrate wafer 4. In this manner, it is possible to produce several—for example, 64 or 128—individual LEDS (light-emitting diodes) per chip. On one wafer there may be, e.g. 120 chips. In this embodiment, the chip structure is as follows: On a GaAs substrate 5, which in this case is of n-type, there is applied an n-type GaAsP layer 6 by epitaxy. The p-type, light-active areas are diffused into this layer 6 in the form of diffusion throughs 8. A layer 7 of $Al_2O_3$ constitutes the diffusion mask and also provides insulation. The diffused areas 8 are provided with p contacts 9. The front side (top side) of the semiconductor substrate wafer 4 is covered with a layer of $Si_3N_4$ 10, which serves as an antireflecting layer or for optical resolution and passivation. The back side (bottom side) of the semiconductor substrate layer 4 is covered with the pervasive metallization layer 1, which, in this example, is adjacent to the back side of the n-type GaAs substrate 5. It must be possible to apply solder and adhesive to the metallization layer 1.

In order to perform the separation procedure, the chip structure is secured by an adhesive to a plastic carrier film that is not shown in the Figure. The separation of the LED chip arrangements that have been monolithically produced on the semiconductor substrate wafer 4 and have the pervasive metallization layer 1 on their back side, is accomplished by scribing at the edges of the arrangement in prescribed tracks 2. In this embodiment, the separate tracks 2 are located in the left and right edge areas of the arrangement or chip structure. Prior to the scribing, the metallization 1 of the back side is exposed, by utilization of a photolithographic process that is customary for this purpose, before etching. In these exposed areas depressions 3 are etched into the back side. Half of each of these depressions is shown in the Figure. In this example, the depth of the depression is approximately 30 μm to 50 μm and its total width is about 60 μm. The wedge error that occurs during scribing is smaller than 5 μm in this example. It is desirable for the scribing to be done in the form of a double cut. In this example, the double cut technique uses the prescribed separation tracks 2, first the left edge and then, in the second separation cut, the right edge of the chip structure is sawed out.

There has thus been shown and described a novel process which fulfills all the objects and advantages sought therefor. Many changes, modifications, variations and other uses and applications of the subject invention will, however, become apparent to those skilled in the art after considering the specification and the accompanying drawing which discloses an embodiment thereof. All such changes, modifications, variations and other uses and applications which do not depart from the spirit and scope of the invention are deemed to be covered by the invention which is limited only by the claims which follow.

What is claimed:

1. A process for the separation of high-resolution LED chip arrangements fabricated monolithically on a semiconductor substrate wafer and having on their back side a pervasive metallization layer and on their border regions separation tracks for arraying the LED chip arrangements in series with further LED chip arrangements, said process comprising the steps of:
   patterning the metallization on the back side to form areas corresponding to the separation tracks,
   etching in the formed areas to provide depressions into the back side of the semiconductor substrate wafer, and then
   separating the LED chip arrangements along said tracks.

2. A process according to claim 1, wherein the patterning step comprises exposure of the metallization of the back side by using a photolithographic process.

3. A process according to claim 1, wherein each etched depression has a mesa structure in cross section and a depth of approximately 30 μm to 50 μm.

4. A process according to claim 1, wherein the separation is carried out as a double saw cut in the areas of the separation tracks.

* * * * *